United States Patent
Kneissl et al.

(10) Patent No.: US 9,331,246 B2
(45) Date of Patent: May 3, 2016

(54) P-CONTACT AND LIGHT-EMITTING DIODE FOR THE ULTRAVIOLET SPECTRAL RANGE

(75) Inventors: Michael Kneissl, Berlin (DE); Markus Weyers, Wildau (DE); Sven Einfeldt, Berlin (DE); Hernan Rodriguez, Bogota (CO)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/384,208

(22) PCT Filed: Jul. 16, 2010

(86) PCT No.: PCT/EP2010/060333
§ 371 (c)(1),
(2), (4) Date: Jan. 13, 2012

(87) PCT Pub. No.: WO2011/006995
PCT Pub. Date: Jan. 20, 2011

(65) Prior Publication Data
US 2012/0146047 A1    Jun. 14, 2012

(30) Foreign Application Priority Data
Jul. 17, 2009    (DE) .................. 10 2009 034 359

(51) Int. Cl.
H01L 33/00    (2010.01)
H01L 33/38    (2010.01)
H01L 33/46    (2010.01)

(52) U.S. Cl.
CPC .............. *H01L 33/387* (2013.01); *H01L 33/46* (2013.01)

(58) Field of Classification Search
CPC ............. H01L 33/00; H01L 21/00; H01S 5/00
USPC ........................................ 257/98, 89; 438/22
See application file for complete search history.

(56) References Cited

U.S. PATENT DOCUMENTS

| | | | |
|---|---|---|---|
| 6,100,586 A * | 8/2000 | Chen et al. | 257/745 |
| 6,531,715 B1 * | 3/2003 | Gerner | 257/81 |
| 7,002,180 B2 * | 2/2006 | Oh et al. | 257/79 |
| 7,095,042 B2 * | 8/2006 | Kim et al. | 257/13 |
| 7,446,341 B2 * | 11/2008 | Bader et al. | 257/79 |
| 2004/0119085 A1 * | 6/2004 | Bader et al. | 257/98 |
| 2004/0159848 A1 * | 8/2004 | Yamaguchi et al. | 257/94 |
| 2005/0104074 A1 * | 5/2005 | Kim et al. | 257/79 |
| 2006/0252165 A1 * | 11/2006 | Kim et al. | 438/22 |
| 2008/0246047 A1 | 10/2008 | Hsu et al. | |
| 2010/0140637 A1 | 6/2010 | Donofrio et al. | |

FOREIGN PATENT DOCUMENTS

| | | |
|---|---|---|
| DE | 199 54 319 C1 | 5/2001 |
| DE | 102 44 986 A1 | 4/2004 |
| EP | 0 880 181 A2 | 11/1998 |

OTHER PUBLICATIONS

International Search Report, dated Nov. 25, 2010, corresponding to PCT/EP2010/060333, 6 pages.

* cited by examiner

*Primary Examiner* — Telly Green
(74) *Attorney, Agent, or Firm* — Lewis Roca Rothgerber Christie LLP

(57) ABSTRACT

The present invention relates to a p-doped contact for use in a light-emitting diode for the ultraviolet spectral range, comprising a p-contact layer having a first surface for contacting a radiation zone and a second surface comprising, on the side facing away from the first surface: a) a coating, which directly contacts 5%-99.99% of the second surface of the p-contact layer and contains or consists of a material having a maximum reflectivity of at least 60% for light with a wavelength of 200 nm to 400 nm; b) a plurality of p-injectors, which are disposed directly on the second surface of the p-contact layer.

18 Claims, 6 Drawing Sheets

A

B

P-CONTACT AND LIGHT-EMITTING DIODE FOR THE ULTRAVIOLET SPECTRAL RANGE

CROSS-REFERENCE TO RELATED APPLICATION

This application is a National Phase Patent Application and claims the priority of International Application Number PCT/EP2010/060333, filed on Jul. 16, 2010, which claims priority of German Patent Application Number 10 2009 034 359.8, filed on Jul. 17, 2009.

An abundance of activity is being directed worldwide at developing light-emitting diodes for the ultraviolet spectral range (UV-LED), since they enable applications in many areas. For example, these include sterilization (e.g., of drinking water, wastewater, process water), disinfection of foodstuffs, medical technology (e.g., dermatology, light therapy), bioanalytics (e.g., fluorescence microscopy), sensor technology (e.g., measurement of nitrous gases, Blankophor measurement), surface polymerization (e.g., printing inks, paints, epoxy resins) and use as radiation sources for free space optical communication. The necessary emission wavelengths and intensities depend heavily on the application, and vary over a broad spectral range. One of the challenges is to realize efficient LED's in the entire spectral range of the UVA and UVB, as well as parts of the UVC range.

In previous approaches to UV-LED's, predominantly Ni/Au, Pt/Ti/Au or Pd/Ti/Au metal layers are used for the ohmic contacts on p-doped group III nitride layers. While these do establish good ohmic contacts with the p-doped semiconductor layers (p-contact layer) of the LED, they are poor reflectors for light in the UV region.

UV-LED's in prior art utilize p-contact layers consisting of p-doped gallium nitride (p-GaN). However, p-contact layers consisting of p-GaN exhibit a pronounced absorption of light in the UV spectral range, in particular at wavelengths of 200 nm to 400 nm.

As a result, the UV-LED's in prior art suffer from a poor light extraction efficiency in the UV range. The quantity of decoupled photons as gauged against the quantity of generated photons only measures 4 to 10%.

The object of the present invention is to avoid or overcome one or more disadvantages to prior art. In particular, the object of the present invention is to provide UV-LED's with improved decoupling of light.

The object is achieved by providing a structured p-contact (the terms "p-doped contact" and "p-contact" will in the following be used interchangeably) for use in a light-emitting diode for the ultraviolet spectral range, comprising a p-contact layer with a first surface for contacting a radiation zone, and a second surface whose side facing away from the first surface:
a) exhibits a coating that directly contacts 5%-99.99% of the second surface of the p-contact layer, and contains or consists of a material that exhibits a maximum reflectivity of at least 60%, preferably of at least 80%, for light in the UV range with a wavelength of 200 nm to 400 nm, preferably for light with a wavelength of 270 nm;
b) exhibits a plurality of p-injectors, which are directly arranged on the second surface of the p-contact layer, characterized in that the p-contact layer (2) exhibits or consists of p-doped AlGaN.

One important approach toward increasing the decoupling of light for LED's involves the provision of p-doped contacts that are highly reflective in the UV spectral range, while at the same time exhibiting a low resistance. No metals or alloys have been found to date that can satisfy both requirements. Metals such as aluminum exhibit a suitable reflectivity for light having a wavelength of 200 nm to 400 nm. For example, the reflectivity of Al against air at 270 nm measures approx. 88%. However, these metals do not establish a low-resistance p-contact in the GaN material system. The present invention is based on the knowledge that, in order to achieve an efficient current injection into the p-contact layer, it is enough if only a portion of the surface of the p-contact layer available for this purpose is actually used, i.e., contacted at a low resistance. The remaining portion of the corresponding surface of the p-contact layer can be provided with a coating that reflects light especially well in the UV range. Since the p-injectors cover relatively small portions of the corresponding surface of the p-contact layer by comparison to the UV light-reflecting coating, it is possible to achieve an overall elevated UV reflectivity of the entire surface, while continuing to ensure an efficient current injection into the p-contact layer. If the p-injectors are also covered by the reflective coating, the UV reflectivity of the p-contact can be increased even further. It is particularly advantageous for the reflective coating to be electrically conductive, and applied completely over the surface of the p-contact layer available for this purpose, as well as the p-injectors, since it then serves simultaneously as a reflector layer (which then also elevates reflectivity in the area of the p-injectors) and electrical connection for the p-injectors. A particularly favorable ratio of high reflectivity to efficient and homogeneous current injection is achieved when the p-injectors are as small as possible and as homogeneously distributed as possible over the available surface of the p-contact layer spaced a suitable distance apart, and if necessary also covered by the reflective coating.

The p-doped contact according to the invention encompasses a p-contact layer and a plurality of p-injectors. The p-contact layer exhibits one or more different p-doped semiconductor layers. The semiconductor layers are here selected in such a way, together with a suitable n-doped contact layer, as to yield a diode with a radiation zone, which when exposed to a voltage emits light in the ultraviolet spectral range in the forward direction of the diode, in particular in the UV-A, UV-B and/or UV-C range, preferably having a wavelength of 200 nm to 400 nm. The p-contact layer contains or consists of p-doped AlGaN. It is especially preferred that at least the semiconductor layer of the p-contact layer contain or consist of p-doped AlGaN, which comprises the second surface of the p-contact layer, and on which the p-injectors are directly applied. This results in an improved light emission.

In the p-contact according to the invention, the p-contact layer exhibits a first and second surface. The first surface of the p-contact layer is designed in such a way as to contact a radiation zone by way of this first surface. A radiation zone is understood as a zone which when exposed to a suitable voltage can emit photons, preferably with a wavelength in the UV spectral range, in particular in the UV-A, UV-B and/or UV-C range, preferably a wavelength of 200 nm to 400 nm. For example, the radiation zone can be formed by a p-n interface in a diode arrangement with a suitable n-doped layer. It is also possible for the radiation zone to be formed by a so-called active zone, which consists of a multiple-quantum well (MQW or multiple quantum well), which in turn is arranged between a p-contact layer according to the invention and an n-doped layer, and, for example, can exhibit (In)AlGaN or consists of the latter. The side of the second surface facing away from the first surface is divided into regions directly covered with a coating, and into regions directly occupied by a plurality of p-injectors. The coating here exhibits a material having a maximum reflectivity of at least 60%, preferably of at least 80%, for light with a wavelength of 200 nm to 400 nm, preferably for light with a wavelength of 270 nm.

The sum total of regions directly covered with a coating amounts to 5% to 99.99% of the total area of the second surface of the p-contact layer, preferably 50% to 99.99%, especially preferred 50% to 99%, most especially preferred 75% to 99%, particularly preferred 75% to 96%. The portion of the second surface of the p-contact layer that is not covered by the coating can be used for arranging a plurality of p-injectors. The p-injectors are here directly applied to the second surface of the p-contact layer, and there is no coating according to the invention between the p-injectors and the second surface of the p-contact layer. However, the p-injectors on the p-contact layer can be covered by the coating according to the invention and/or be in contact with the latter. This can be the case in particular when the coating according to the invention is applied or deposited over the entire surface of the second surface of the p-contact layer with p-injectors already placed thereon.

The p-injectors are used to establish an ohmic contact between the p-injectors and the p-contact layer, and hence to ensure an efficient current injection from a current source into the p-contact layer via the p-injectors. Typical specific contact resistances here range from $10^{-2}$ to $10^{-4}$ $\Omega \cdot cm^2$ or below. What is essential is that the p-injectors are directly applied to the second surface of the p-contact layer, and no coating according to the invention is provided between the p-injector and p-contact layer. The sum total of areas occupied by p-injectors added to the sum total of areas covered by the coating can here be equal to or less than the total area of the second surface of the p-contact layer. Preferably, the total area of the second surface of the p-contact layer not occupied by p-injectors is covered with the coating.

The coating exhibits a material having a maximum reflectivity of at least 60%, preferably of at least 80%, especially preferred of at least 85%, for light with a wavelength of 200 nm to 400 nm, preferably for light with a wavelength of 270 nm. Maximum reflectivity is understood as a reflectivity that no longer continues to rise, even given a further increase in the layer thickness of the material to be considered. The expert is familiar with suitable materials and suitable methods for testing reflectivity, so that the expert can, without any undue effort, reliably determine for a specific material whether it exhibits the necessary maximum reflectivity for light having a wavelength of 200 nm to 400 nm, preferably for light having a wavelength of 270 nm. One example for such a material is aluminum (Al), which exhibits a maximum reflectivity at 270 nm of approx. 88%. The material or material mixture of the coating is preferably electrically conductive, so that the coating according to the invention, for example when applied both over the surface of the p-contact layer provided for this purpose and over the p-injectors, simultaneously serves as a reflector layer and electrical connection between the p-injectors.

The p-injectors exhibit at least one p-injector metal layer, which enables an efficient ohmic connection of the p-contact layer with a pole of a current or voltage source. Since the p-injectors need not themselves be UV reflective, the selection of suitable materials is not limited to those that also exhibit a good reflectivity in the UV range. As a result, use can also be made of materials and metals that have already been used in prior art during the manufacture of p-injectors. In particular, the p-injectors can exhibit a p-injector metal layer that contains or consists of Au, Ni, Pd, Pt, Rh, Ti, Ni/Au, Pd/Ti/Au, Pd/Pt/Au or Pt/Ti/Au. Aside from such a p-injector metal layer, the p-injectors can also exhibit additional metal and/or non-metal layers, provided these additional layers do not cause an ohmic connection of the p-contact layer with a pole of a current or power source to be prevented or significantly functionally impaired by the p-injectors. In particular, the p-injectors can also exhibit a p-injector layer that contains or consists of a p-doped semiconductor, for example p-GaN or p-InGaN. This is preferred in particular when the semiconductor layer, which forms the second surface (B) of the p-contact layer (2) and to which the p-injectors are directly applied, exhibits or consists of p-doped AlGaN. As a result a p-contact is obtained characterized by an especially favorable ratio of light emission to electrical properties.

The p-doped contact according to the invention is characterized by especially favorable properties when the p-injectors arranged on the second surface of the p-contact layer exhibit a special shape, dimensions and/or structure. The p-injectors can here be present in the form of ohmic contacts distributed like nanopixels over the entire second surface of the p-contact layer. The p-injectors are preferably arranged in a constant pattern on the second surface of the p-contact layer.

The p-injectors can exhibit a quadrilateral, rectangular, square, round, elliptical, triangular and/or polytonal shape. The p-injectors can also be linear, e.g., arranged as parallel lines or crossing lines. The p-injectors of a p-contact according to the invention can here exhibit the same or different shapes.

The individual p-injectors each preferably exhibit a maximum width D of 10 nm to 50 µm, preferably of 10 nm to 2 µm, especially preferred of 50 nm to 1 µm. A maximum width is understood as a maximum expansion of the p-injectors in a first dimension x that is no larger than a maximum expansion of the p-injectors in a second dimension y (a maximum length), wherein the first and second dimensions (x, y) are at a right angle to each other. Given a rectangular shape, the maximum width corresponds to the short side of the rectangle, while the maximum length corresponds to the long side; in the case of a circle, the maximum width corresponds to the diameter; for a square, the maximum width corresponds to any side desired; etc.

The majority of p-injectors can be randomly distributed on the second surface of the p-contact layer, but preferably in a predetermined manner. To this end, the p-injectors can be spaced a distance A away from their respectively adjacent p-injectors measuring 20 nm to 20 µm, preferably 20 nm to 5 µm, especially preferred 100 nm to 2 µm. The p-injectors of a p-contact according to the invention can be uniformly distributed on the second surface of the p-contact layer. To this end, the selected distances A between the p-injectors and their respectively adjacent p-injectors can be identical for all p-injectors.

In particular, D and A can be selected in such a way that the ratio of D to A measures 1:1 to 1:4. In a special embodiment, D is 0.5 µm, and A is selected from a range of 0.5 µm to 2 µm. Alternatively, D can be selected from the range of 50 nm to 100 nm, and A from the range of 100 nm to 200 nm.

The p-contact according to the invention can be fabricated by first preparing the p-contact layer with known methods, e.g., in an epitaxy process, such as metal-organic vapor phase epitaxy, molecular beam epitaxy, or hydride vapor epitaxy, in a manner known in the art. P-injectors can be separated with different methods, e.g., electron beam evaporation, thermal evaporation or sputter techniques. The contacts are structured using lithographic processes, such as photolithography, nanoimprinting, and electron beam processes.

The present invention relates to a light-emitting diode encompassing a p-doped contact according to the invention. In particular, the invention relates to a light-emitting diode encompassing a radiation zone arranged between an n-doped contact and a p-doped contact according to the invention, and preferably emits light in the UV range, particularly preferred in the UV-A, UV-B and/or UV-C range, most especially preferred light having a wavelength of 200 nm to 400 nm. In another preferred embodiment, the light-emitting diode emits light with a wavelength of 200 nm to 380 nm, or 200 nm to 350 nm.

Figure 4:
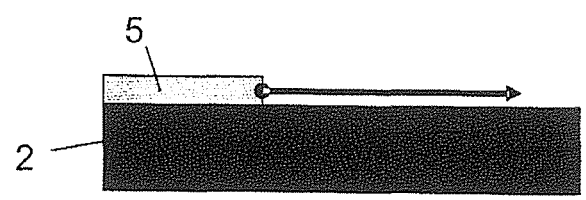
Figure 4:
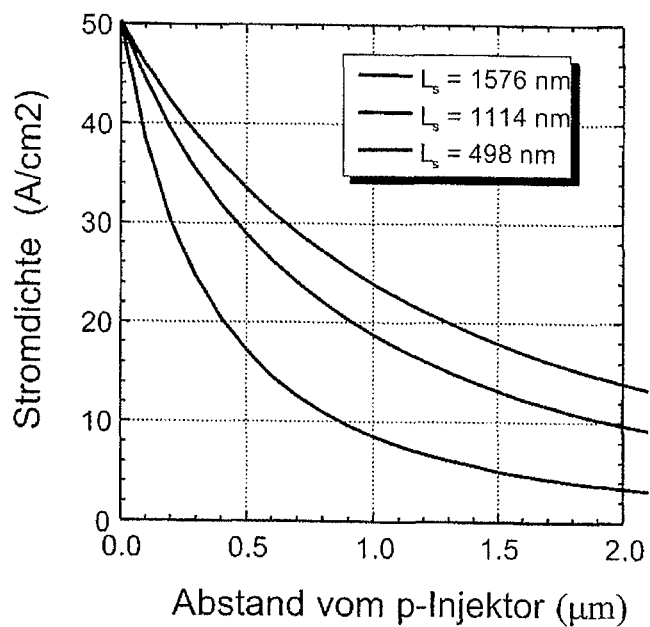

FIG. 4 FIG. 4A diagrammatically depicts the length described by the indication "distance from contact" (distance from p-injector); FIG. 4B lists the calculated current densities as a function of the respective distance to the p-injector, wherein the curves for three p-contacts with varying Ls ("current spreading length"=distance from p-injector at which the current density has dropped to 1/e) are shown.

Figure 5:
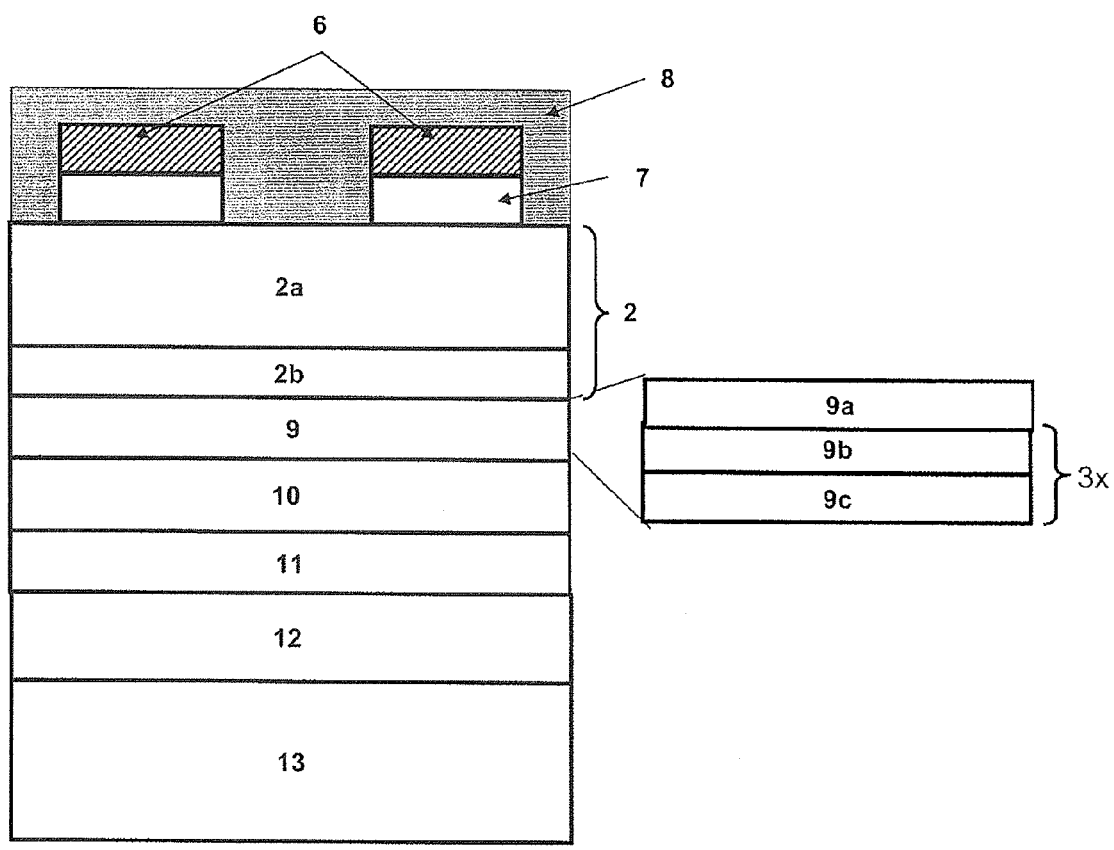

FIG. 5 shows a diagrammatic view of the layer structure of a UV light-emitting diode containing a p-contact according to the invention.

Figure 6:
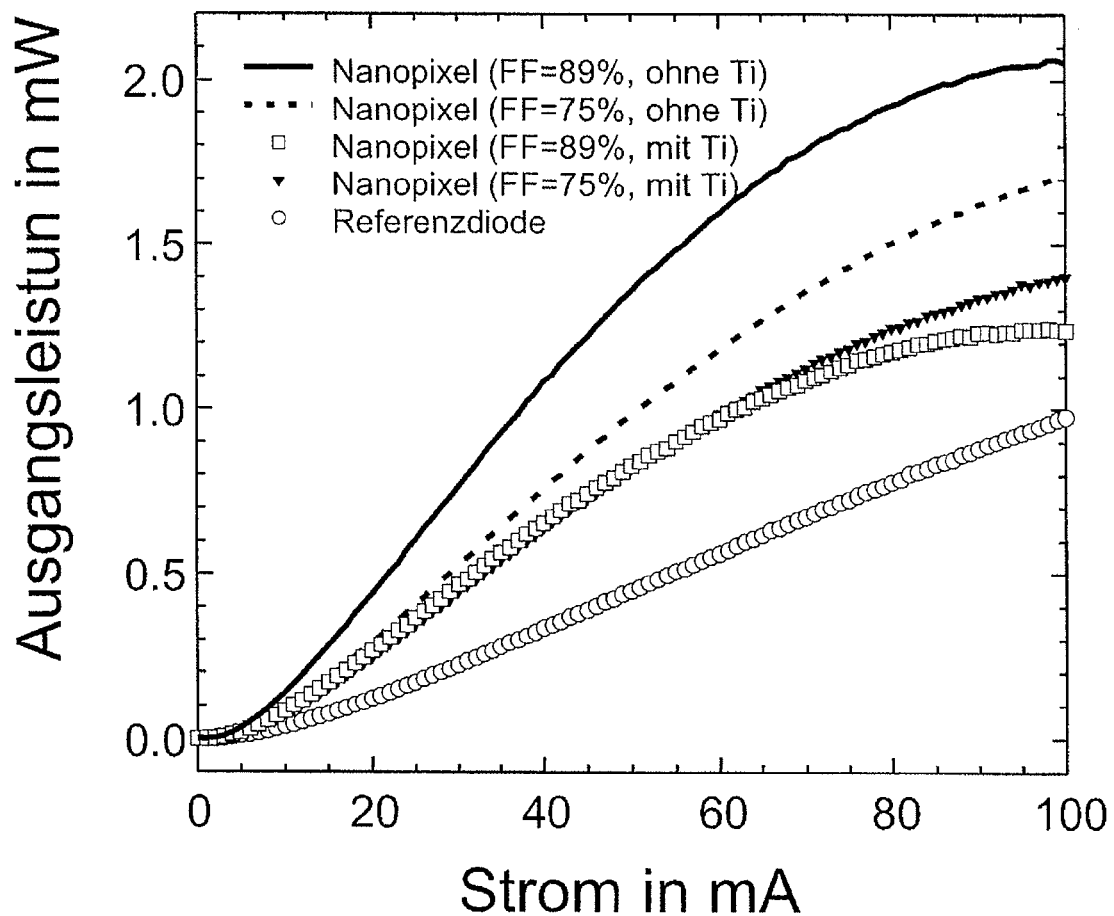

FIG. 6 shows light output-current curves for various nanopixel LED's as compared to a reference diode with unstructured Pd contact. Two nanopixel LED geometries were compared: One LED with a contact side length of D=1 μm and a distance of A=1 μm (fill factor FF=75%), and another nanopixel LED with a contact side length of D=1 μm and a distance of A=2 μm (fill factor FF=89%). One half of the wafer with nanopixel LED's was manufactured with a Ti/Al/Pt/Au (5/50/40/400 nm) reflective layer, the other with a UV reflecting metal layer system without the Ti adhesive layer (only Al/Pt/Au with a layer thickness of 50/40/400 nm). The emission wavelength measured 380 nm for all LED's.

The invention will be described in greater detail below based on selected exemplary embodiments.

Example 1

Configuration of a P-Doped Contact According to the Invention

Figure 1:
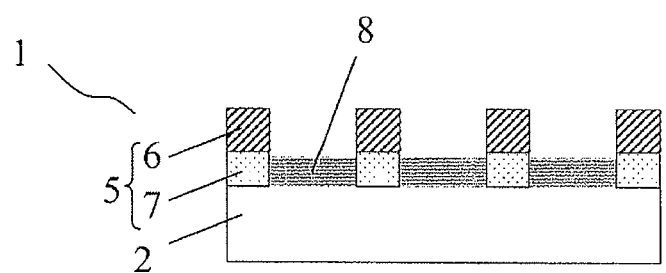
FIG. 1 shows a diagrammatic view of the configuration of a p-doped contact according to the invention, wherein the p-injectors exhibit an Ni/Au layer and a p-(In)GaN layer, the coating consists of Al, and the p-contact layer exhibits a p-AlGaN layer.

FIG. 1 shows a diagrammatic view of an exemplary embodiment of a p-doped contact according to the invention. The p-doped contact 1 according to the invention exhibits a p-contact layer 2 and a plurality of p-injectors 5. The p-contact layer 2 here exhibits a first surface A, which is designed in such a way that it can be contacted with a suitable radiation zone in an LED arrangement. The p-contact layer 2 exhibits a second surface B, wherein a coating 8 and a plurality of p-injectors 5 are applied to the side of surface B facing away from the first surface A.

The p-contact layer 2 is formed by a p-AlGaN layer, and hence especially UV transparent.

A plurality of p-injectors 5 are arranged on the surface B of the p-contact layer 2, wherein the p-injectors 5 are directly connected with the surface B. The p-injectors 5 are designed in such a way as to establish an ohmic contact between the p-injectors 5 and the p-contact layer 2, which makes it possible to conductively connect the p-contact layer 2 (with low resistive losses) with a pole of a current or voltage source. The p-injectors 5 exhibit two layers, specifically a p-injector metal layer 6 facing away from the surface B, for example an Ni/Au metal layer, and an additional p-injector layer 7 arranged between the p-injector metal layer 6 and p-contact layer 2, for example a p-(In)GaN semiconductor layer. The p-injector metal layer 6 is used to bring about a low-resistance contact with a pole of a current and/or voltage source. The p-injector layer 7 is used to achieve the most effective possible current injection into the p-contact layer 2. The p-injectors 5 are secured to the surface B of the p-contact layer 2 spaced uniformly apart.

Those parts of the surface B not occupied by p-injectors 5 exhibit a coating 8 with a material that reflects at least 60%, preferably at least 80%, of light with a wavelength of 270 nm. In the example on FIG. 1, the coating 8 consists of an aluminum layer (Al) with a layer thickness of 50 to 350 nm.

Figure 2:
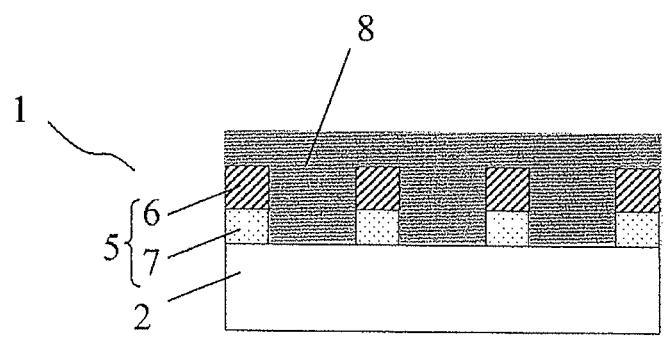
FIG. 2 shows a diagrammatic view of the configuration of a p-doped contact according to the invention as on FIG. 1, wherein a reflective coating additionally covers the p-injectors as well.

FIG. 2 depicts another embodiment of the p-doped contact according to the invention. This additional embodiment only differs from the embodiment on FIG. 1 in that the Al coating also covers the p-injectors 5. Since the coating 8 consists of Al, the latter is electrically conductive, and electrically connects the p-injectors 5 with each other.

Figure 3:
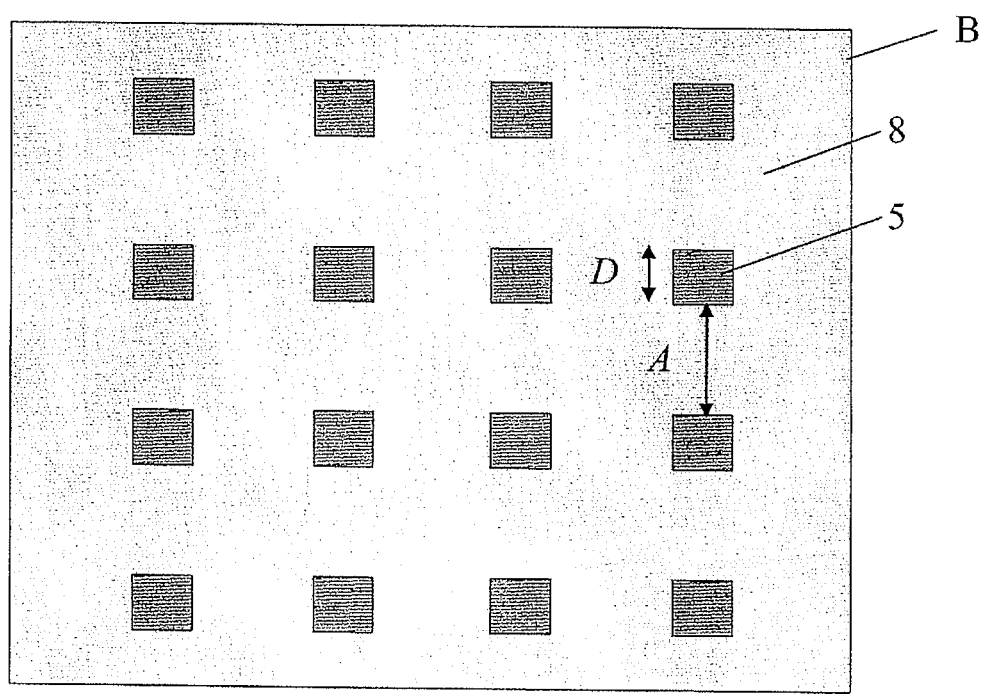
FIG. 3 shows a diagrammatic view of the structure of a second surface B of a p-contact layer of the p-doped contact according to the invention from FIG. 1, wherein the p-injectors are uniformly distributed, shaped like a square with an edge length of 0.5 μm and spaced 1 μm apart from each other.

FIG. 3 shows a diagrammatic top view of the structure of a second surface B of a p-contact layer of the p-doped contact according to the invention from FIG. 1, including the coating 8 and p-injectors 5. The p-injectors 5 exhibit a square shape, with a maximum width D of 0.5 μm. The p-injectors 5 are here uniformly distributed on the surface B of the p-contact layer 2, and each spaced apart from the respectively adjacent p-injectors 5 by a uniform distance A of 1 μm. Those parts of the surface B not occupied by p-injectors 5 exhibit a coating 8 consisting of aluminum with a reflectivity of 88% at 270 nm. The coating 8 covers ~90% of the surface B of the p-contact layer 2. As a consequence, the entire surface B including the coating 8 and p-injectors 5 exhibits a maximum reflectivity of approx. 79%. This reflectivity is higher than any reflectivity achievable with conventional low-resistance p-contacts.

Example 2

Model Calculation for the Reduction in Current Density as a Function of the Distance from the P-Injector To also enable use of the p-doped contact according to the invention in an LED, it is necessary that sufficient current be injected into the p-contact layer of the p-doped contact. FIG. 4B shows the calculated reduction in current density in a p-contact layer of an LED with increasing distance from the ohmic p-injector. The calculations are based on a simple analytical model according to G. H. B. Thompson (*Physics of Semiconductor Laser Devices*, john Wiley & Sons (1980)) and Hyunsoo Kim et al. (*Measurements of current spreading length and design of GaN-based light emitting diodes*, Appl. Phys. Lett. 90, 063510 (2007)). During the simulation, it was assumed that no current is being injected via the (comparatively high-resistance) aluminum reflectors. The remaining parameters of the model simulation are presented in Table 1.

TABLE 1

| Model simulation parameters | | | |
|---|---|---|---|
| | A | B | C |
| P-contact layer thickness $d_p$ [nm] | 300 | 300 | 600 |
| Charging carrier density in p-contact layer p [cm$^{-3}$] | 1E+17 | 5E+17 | 5E+17 |
| Charge mobility in p-contact layer [cm$^2$/Vs] | 10 | 10 | 10 |
| "Current spreading length" $L_s$ [nm] | 498 | 1114 | 1576 |

FIG. 4B shows the calculated current density in the p-AlGaN layer (the p-contact layer of the model and Example 1) as a function of the distance from the p-injector. FIG. 4A diagrammatically illustrates which length this refers to. FIG. 4B shows the results for three different p-contacts each having different $L_s$. The variable $L_s$ here denotes the so-called "current spreading length" (the current spreading length), and hence the distance from the p-injector at which the current density dropped to 1/e. The "current spreading length" in turn depends on the thickness, charge carrier density and mobility in the p-doped layers (see Table 1).

While the current density dips slightly from 50 A/cm$^2$ to 25 A/cm$^2$ for a p-injector with a maximum width D of 0.5 µm and a distance A between the p-contacts of 1 µm, a p-contact layer of p-AlGaN corresponding to model C (e.g., as in Example 1), it is still sufficient to ensure an effective operation of the p-doped contact in an LED. In this case, the calculation has not yet taken into account that inhomogeneities in the real nanopixel structure would be distinctly lower, since the sum total of respectively calculated current densities of the surrounding p-injectors is reached as the result of the charge carrier injection from the nearest neighboring injector for a specific point of the P-contact layer.

Example 3

UV Light-Emitting Diode Containing a P-Contact According to the Invention

FIG. 5 shows a diagrammatic sectional view of an exemplary embodiment of a light-emitting diode according to the invention containing a p-contact according to the invention.

According to the invention, the UV light-emitting diode encompasses a p-contact comprising p-injectors, which each consist of a p-injector metal layer 6 and a p-(In)GaN injector layer 7. In the example shown, the p-(In)GaN injector layers 7 each exhibit dimensions of 10 nm p-(In)GaN, with a magnesium (Mg) doping concentration of [Mg]=1E20 cm$^{-3}$. The p-(In)GaN injector layers 7 are in direct contact with a p-contact layer 2 consisting of p-doped AlGaN. In the example shown, the p-contact layer consists of an alternating sequence 2a of two p-doped AlGaN layers with the following compositions: p-Al$_{0.45}$Ga$_{0.55}$N and p-Al$_{0.55}$Ga$_{0.45}$N; wherein the individual layers exhibit a thickness of 2 nm, and the p-contact layer exhibits a total of 50 layers of the one composition, and 50 layers of the other, and its layers have an Mg doping concentration of [Mg]=5E19 cm$^{-3}$. The side of the p-contact layer facing away from the p-injectors exhibits a terminal 20 nm thick layer 2b with the composition p-Al$_{0.60}$Ga$_{0.40}$N (with [Mg]=1E20 cm$^{-3}$). The surface of the p-contact layer 2 contacting the p-injectors is covered with a coating according to the invention. In the example shown, the coating 8 is configured in such a way that the coating 8 covers not just a surface of the p-contact layer 2, but also the p-injectors. In the example shown, the side of the p-contact layer 2 facing away from the p-injectors is adjoined by a multiple-quantum well structure 9. This multiple-quantum well structure 9 can consist of a regular sequence of layers of n quantum well layers and n+1 barrier layers. In the example shown, the multiple-quantum well structure 9 consists of a 6 nm thick (In)Al$_{0.5}$Ga$_{0.5}$N barrier layer 9a and a layer sequence made up of a 2 nm thick (In)Al$_{0.4}$Ga$_{0.6}$N quantum well layer 9b and a 6 µm thick (In)Al$_{0.5}$Ga$_{0.5}$N barrier layer 9c that repeats three times. This is followed on the side of the multiple-quantum well structure 9 facing away from the p-contact layer by a 1500 nm thick layer 10 consisting of n-Al$_{0.5}$Ga$_{0.5}$N with a silicon (Si) doping concentration of [Si]=5E18 cm$^{-3}$. The n-doped layer 10 is followed by a 200 nm thick layer 11 consisting of undoped Al$_{0.5}$Ga$_{0.5}$N. This is in turn followed by a 1000 nm thick layer 12 consisting of undoped AlN. This layer 12 is covered by a sapphire layer 13 on the side facing away from the p-contact.

Example 4

Comparison of UV-LED According to the Invention to Prior Art

The UV-LED structure was grown on a (0001)-oriented sapphire substrate with a diameter of two inches (50 mm) in the physical coating process called metal-organic vapor phase epitaxy (abbreviated MOVPE). The layer structure consists of a silicon-doped 3.4 µm thick GaN buffer layer, a 10 nm Si-doped Al$_{0.23}$Ga$_{0.77}$N hole barrier, an active zone consisting of five 3 nm thick In$_{0.04}$GaN quantum films separated by 6 nm thick In$_{0.04}$Al$_{0.16}$GaN barriers (English: "multiple-quantum wells", abbreviated MQW), followed by a 10 nm, magnesium-doped Al$_{0.23}$Ga$_{0.77}$N electron barrier layer, and concluding with a 200 nm thick Mg-doped GaN layer. After the MOVPE, p-doping was activated in a rapid thermal annealing (RTA) furnace at 815 degrees Celsius for 10 minutes in a nitrogen atmosphere.

The components were then structured using processing technology. A number of square Pd contacts were structured on the second surface of the p-contact layer with an area of 0.0225 mm$^2$. The palladium has a layer thickness of 30 nm, and was separated out via electron beam evaporation. The Pd covering factor measures 25% for a contact side length of D=1 µm and distance of A=1 µm, and 11% for D=1 µm, A=2 µm. The p-electrode contains a UV-reflective aluminum layer, and consists of the metal system Al (50 nm)/Pt (40 nm)/Au (400 nm). The UV-reflective metal system covers both the p-injectors and the free GaN areas. In other words, the percentage of the area covered by the UV-reflective layer (corresponds to the fill factor, FF for short) measures a respective 75% and 89%. In half the samples, a thin Ti layer was inserted between the GaN surface and aluminum reflector as the coupling agent to improve adhesion between the Al and GaN, i.e., the layer sequence in this case corresponds to the metal system Ti (5 nm)/Al (50 nm)/Pt (40 nm)/Au (400 nm). Since Ti is not a good UV reflector, only a 5 nm thick Ti layer was vapor deposited in order to minimize the absorption. After the p-side metallization concluded, an inductively coupled plasma dry etching process was conducted in a Cl$_2$ and BCl$_3$ atmosphere to etch out 150 µm×150 µm mesa-structures, which extend up to the n-doped GaN buffer layer. The n-metallization Ti (10 nm)/Al (50 nm)/Mo (20 nm)/Au (200 nm) was then vapor deposited. The entire chip size measures 500 µm×500 µm.

FIG. 6 shows the measured light output-current curves for various nanopixel-LED's as compared to a reference diode with unstructured Pd contact and without Al coating. The best results were achieved with the nanopixel LED having an FF=89% and no Ti adhesive layer. At a forward current of 50 mA, the latter exhibits a light output of 1.36 mW (measured on-wafer), which is more than three times the luminous power of the reference diode (0.45 mW at 50 mA).

REFERENCE LIST 1 p-contact
2 p-contact layer consisting of p-doped AlGaN
   2a Alternating sequence of two p-AlGaN layers with the compositions p-$Al_{0.45}Ga_{0.55}N$ and p-$Al_{0.55}Ga_{0.45}N$
   2b Layer with the composition p-$Al_{0.60}Ga_{0.40}N$
5 p-injector
6 p-injector metal layer consisting of Ni/Au
7 p-injector layer consisting of (In)GaN
8 Coating with a material that reflects at least 60%, preferably at least 80%, of light with a wavelength of 270 nm
9 Multiple-quantum well layer
   9a (In)$Al_{0.5}Ga_{0.5}N$ barrier layer
   9a (In)$Al_{0.4}Ga_{0.6}N$ quantum well layer
   9a (In)$Al_{0.5}Ga_{0.5}N$ barrier layer
10 n-doped layer consisting of n-$Al_{0.5}Ga_{0.5}N$
11 Undoped layer consisting of $Al_{0.5}Ga_{0.5}N$
12 Undoped layer consisting of AlN
13 Sapphire layer
A First surface of the p-contact layer 2
B Second surface of the p-contact layer 2

The invention claimed is:

1. A p-doped contact for use in a light-emitting diode for the ultraviolet spectral range, the p-doped contact comprising:
   a p-contact layer comprising AlGaN and having a first surface for contacting a radiation zone, and a second surface opposite the first surface;
   a coating covering 75%-96% of the second surface of the p-contact layer, the coating comprising a material having a maximum reflectivity of at least 60% for light in a UV range with a wavelength of 200 nm to 400 nm; and
   a plurality of p-injectors arranged on the second surface of the p-contact layer, the p-injectors comprising a p-injector metal layer and at least one other p-injector layer in direct contact with the p-injector metal layer, the at least one other p-injector layer comprising p-GaN or p-(In)GaN.

2. The p-doped contact according to claim 1, wherein the coating is electrically conductive.

3. The p-doped contact according to claim 1, wherein the coating further covers one or more p-injectors of the p-doped contact.

4. The p-doped contact according to claim 1, wherein the coating comprises Al.

5. The p-doped contact according to claim 1, wherein the p-injectors comprise at least one p-injector metal layer, which enables an ohmic connection of the p-contact layer with a current source.

6. The p-doped contact according to claim 1, wherein the p-injectors comprise a p-injector metal layer comprising at least one of Au, Ni, Pd, Pt, Rh, Ti, Ni/Au, Pd/Ti/Au, Pd/Pt/Au or Pt/Ti/Au.

7. The p-doped contact according to claim 1, wherein the p-contact layer comprises one or more different semiconductor layers.

8. The p-doped contact according to claim 1, wherein the p-contact layer further comprises a semiconductor layer, which forms the second surface of the p-contact layer and to which the p-injectors are applied, comprising p-doped AlGaN.

9. The p-doped contact according to claim 1, wherein the p-injectors have a maximum width D of 10 nm to 50 µm.

10. The p-doped contact according to claim 1, wherein the p-injectors are spaced a distance A of 20 nm to 20 µm away from their respectively adjacent p-injectors.

11. The p-doped contact according to claim 1, wherein distances A between the p-injectors and their respective adjacent p-injectors are identical for all p-injectors.

12. The p-doped contact according to claim 1, wherein the p-injectors have a maximum width D, the p-injectors are spaced at a distance A, and D and A are selected in such a way that a ratio D to A is between 1:1 and 1:4.

13. The p-doped contact according to claim 1, wherein the p-injectors are arranged in a uniform pattern on the second surface of the p-contact layer.

14. A light-emitting diode comprising a radiation zone, which is arranged between an n-doped contact and the p-doped contact according to claim 1.

15. The light-emitting diode according to claim 14, wherein the light-emitting diode is configured to emit light in the UV range of 200 nm to 400 nm.

16. The light-emitting diode according to claim 15, wherein the light emitting diode is configured to emit light in at least one of a UV-A range, a UV-B range, or a UV-C range.

17. The p-doped contact according to claim 1, wherein the at least one other p-injector layer consists of p-GaN or p-(In)GaN.

18. The p-doped contact according to claim 1, wherein the at least one other p-injector layer has a cross section that substantially matches that of the p-injector metal layer in a plane parallel to a surface of the p-contact layer.

* * * * *